US012564110B2

(12) United States Patent
Choi et al.

(10) Patent No.: US 12,564,110 B2
(45) Date of Patent: Feb. 24, 2026

(54) DISPLAY DEVICE AND MANUFACTURING METHOD THEREOF

(71) Applicant: SAMSUNG DISPLAY CO., LTD., Yongin-si (KR)

(72) Inventors: Jin Woo Choi, Yongin-si (KR); Min Woo Kim, Yongin-si (KR); Dae Ho Song, Yongin-si (KR); Hyung II Jeon, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 1 day.

(21) Appl. No.: 18/653,575

(22) Filed: May 2, 2024

(65) Prior Publication Data

US 2024/0282760 A1 Aug. 22, 2024

Related U.S. Application Data

(63) Continuation of application No. 17/285,328, filed as application No. PCT/KR2018/015851 on Dec. 13, 2018, now Pat. No. 11,996,395.

(30) Foreign Application Priority Data

Oct. 15, 2018 (KR) ......................... 10-2018-0122800

(51) Int. Cl.
*H01L 21/683* (2006.01)
*H01L 23/00* (2006.01)
*H01L 25/16* (2023.01)

(52) U.S. Cl.
CPC ........ *H01L 25/167* (2013.01); *H01L 21/6835* (2013.01); *H01L 24/95* (2013.01); (Continued)

(58) Field of Classification Search
CPC ... H01L 25/167; H01L 21/6835; H01L 24/95; H01L 2221/68368; H01L 2221/68381; (Continued)

(56) References Cited

U.S. PATENT DOCUMENTS 5,110,388 A 5/1992 Komiyama et al.
6,613,610 B2 9/2003 Iwafuchi et al.
(Continued)

FOREIGN PATENT DOCUMENTS

CN 102683391 9/2012
CN 104425553 3/2015
(Continued)

OTHER PUBLICATIONS

International Search Report, with English translation, corresponding to International Application No. PCT/KR2018/015851 dated Jul. 9, 2019.
(Continued)

*Primary Examiner* — Vu A Vu
(74) *Attorney, Agent, or Firm* — CANTOR COLBURN LLP

(57) ABSTRACT

A display device and a method of manufacturing the display device are proposed. The method may include disposing light emitting elements on a first transfer film; stretching the first transfer film so that the plurality of light emitting elements are spaced apart from each other; transferring the light emitting elements onto a thin film transistor array substrate; and removing the transfer film from the light emitting elements.

25 Claims, 9 Drawing Sheets

PA

(52) U.S. Cl.
    CPC ............... *H01L 2221/68368* (2013.01); *H01L 2221/68381* (2013.01); *H01L 2224/95001* (2013.01)

(58) Field of Classification Search
    CPC ... H01L 2224/95001; H01L 2933/0033; H01L 25/0753; H01L 23/528; H01L 27/12; H01L 27/15; H01L 33/36; H01L 27/1214; H01L 27/156
    USPC .......................................................... 257/88
    See application file for complete search history.

(56)           References Cited

U.S. PATENT DOCUMENTS

| | | | | |
|---|---|---|---|---|
| 6,702,910 | B2 * | 3/2004 | Noguchi | ............. H01L 21/6836 428/113 |
| 8,114,689 | B2 * | 2/2012 | Kang | .................. H01L 33/0095 257/E33.059 |
| 8,236,582 | B2 * | 8/2012 | Neff | ........................ H01L 33/46 438/22 |
| 9,029,880 | B2 | 5/2015 | Sakariya et al. | |
| 9,871,167 | B2 * | 1/2018 | Moran | .................... H01L 33/44 |
| 9,954,139 | B2 | 4/2018 | Krause et al. | |
| 10,008,405 | B2 | 6/2018 | Iwanaga et al. | |
| 10,008,610 | B2 | 6/2018 | Park | |
| 10,050,026 | B2 * | 8/2018 | Takeya | .................. H01L 33/504 |
| 10,062,738 | B2 * | 8/2018 | Forrest | .................. H10K 71/00 |
| 10,158,051 | B2 | 12/2018 | He | |
| 10,192,858 | B2 | 1/2019 | Higginson et al. | |
| 10,254,906 | B2 | 4/2019 | Gotoh et al. | |
| 10,276,758 | B2 * | 4/2019 | Wei | ....................... H01L 33/507 |
| 10,290,622 | B2 | 5/2019 | Li et al. | |
| 10,804,154 | B2 | 10/2020 | Zhao | |
| 10,886,158 | B2 * | 1/2021 | Benaissa | ................. H01L 25/50 |
| 11,430,373 | B2 * | 8/2022 | Robin | ................. H01L 25/0753 |
| 2010/0279437 | A1 | 11/2010 | Neff et al. | |
| 2015/0069346 | A1 | 3/2015 | Kim et al. | |
| 2016/0043254 | A1 * | 2/2016 | Krause | ............... H01L 21/6835 136/244 |
| 2016/0111604 | A1 | 4/2016 | Li et al. | |
| 2017/0062514 | A1 * | 3/2017 | Park | .................. H10D 30/6755 |
| 2017/0243773 | A1 | 8/2017 | Hwang | |
| 2017/0301660 | A1 | 10/2017 | Pokhriyal et al. | |
| 2019/0310514 | A1 | 10/2019 | Kim et al. | |
| 2019/0363069 | A1 | 11/2019 | Ahmed et al. | |
| 2020/0020561 | A1 | 1/2020 | Benaissa | |

FOREIGN PATENT DOCUMENTS

| | | |
|---|---|---|
| CN | 106794679 | 5/2017 |
| JP | 2002-368288 | 12/2002 |
| JP | 2003-203881 | 7/2003 |
| JP | 2007-73995 | 3/2007 |
| JP | 2012-156288 | 8/2012 |
| KR | 10-2017-0026954 | 3/2017 |
| KR | 10-2018-0008712 | 1/2018 |
| WO | 2005/122285 | 12/2005 |

OTHER PUBLICATIONS

Written Opinion, with English translation, corresponding to International Application No. PCT/KR2018/015851, dated Jul. 9, 2019.
Gi Young Byun et al., "Strategy for Developing MicroLED in Era of Fourth Industrial Revolution", Korea Evaluation Institute of Industrial Technology, KEIT PD Issue Report, Jun. 2017, p. 67, vol. 17-6.

* cited by examiner

DISPLAY DEVICE AND MANUFACTURING METHOD THEREOF

CROSS-REFERENCE TO RELATED APPLICATION(S)

This is a continuation application of U.S. patent application Ser. No. 17/285,328, filed on Apr. 14, 2021 (now U.S. Pat. No. 11,996,395 issued May 28, 2024), the disclosure of which is incorporated herein by reference in its entirety. U.S. patent application Ser. No. 17/285,328 is a national entry of International Application No. PCT/KR2018/015851, filed on Dec. 13, 2018, which claims under 35 U.S.C. § 119 (a) and 365(b) priority to and benefits of Korean Patent Application No. 10-2018-0122800, filed on Oct. 15, 2018 in the Korean Intellectual Property Office, the entire contents of which are incorporated herein by reference.

BACKGROUND

1. Field of Disclosure

Embodiments of the disclosure relate to a display device and a method of manufacturing the display device.

2. Description of the Related Art

A display device displays an image with the combination of lights emitted from multiple pixels. In the display device, each pixel includes a pixel circuit and a display element that is controlled by the pixel circuit. A light emitting diode is a self-emissive element that may include a pixel electrode, an emission layer, and a common electrode. The light emitting diode emits light.

One of the pixel electrode and the common electrode is an anode for hole injection, while the other is a cathode for electron injection. Holes injected from the anode and electrons injected from the cathode combine in the emission layer to generate excitons, and the excitons emit energy to emit light.

The light emitting diode may be formed on a backplane by a pick and place method or a roll transfer method. These conventional methods require precise alignment between a pixel area and the light emitting diode during the transfer process and require a process of individually bonding light emitting diodes, so the complexity is high and the process time is long.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Embodiments of the disclosure provide a display device where a light emitting diode is formed on a thin film transistor array substrate, or TFT array substrate, using a stretchable transfer film and a method of manufacturing the display device.

According to an aspect of the disclosure, a method of manufacturing a display device may include disposing a plurality of light emitting elements on a first transfer film; stretching the first transfer film so that the plurality of light emitting elements are spaced apart from each other; transferring the plurality of light emitting elements onto a thin film transistor (TFT) array substrate; and removing the first transfer film from the plurality of light emitting elements.

The first transfer film may be formed of a stretchable material.

The first transfer film may be formed of a material including at least one of polyolefine, polyvinyl chloride (PVC), elastomeric silicone, elastomeric polyurethane, and elastomeric polyisoprene.

The first transfer film may be stretched such that the plurality of light emitting elements may have a density corresponding to a pixel area of a thin film transistor (TFT) array substrate.

The first transfer film may be stretched at least in two directions of which one direction intersects another direction.

The method may further include transferring the plurality of light emitting elements disposed on the first transfer film to a second transfer film, after the stretching of the first transfer film; and stretching the second transfer film so that the plurality of light emitting elements are further spaced apart from each other.

The transferring of the plurality of light emitting elements onto the thin film transistor (TFT) array substrate may include irradiating an infrared laser onto a rear surface of the first transfer film, the rear surface facing the plurality of light emitting elements.

The removing of the first transfer film may include irradiating an ultraviolet laser or heat onto the first transfer film.

The removing of the transfer film comprises removing together with the first transfer film, a light emitting element that has not been transferred to a pixel area of the thin film transistor (TFT) array substrate.

The thin film transistor (TFT) array substrate may include a substrate, a transistor on the substrate, a planarization layer on the transistor, and a first electrode on the planarization layer, and the plurality of light emitting elements may be transferred onto the first electrode.

The first electrode may be formed on an entire area of a pixel area of the thin film transistor (TFT) array substrate.

The first electrode may be electrically connected to the transistor through a via hole formed in the planarization layer.

Each of the plurality of light emitting elements may include a first semiconductor layer, a second semiconductor layer, and an intermediate layer between the first semiconductor layer and the second semiconductor layer, and the plurality of light emitting elements may be transferred such that the first semiconductor layer contacts the first electrode.

The method may further include forming an overcoat layer on the planarization layer to which the plurality of light emitting elements are transferred; etching the overcoat layer such that an end of each of the plurality of light emitting elements may be exposed; and forming a second electrode on the etched overcoat layer.

The second electrode may be formed to cover an entire area of the etched overcoat layer.

According to an aspect of the disclosure, a display device may include a substrate including a plurality of pixels; a first electrode disposed on each of the plurality of pixels; a plurality of light emitting elements disposed on the first electrode; and a second electrode disposed on the plurality of light emitting elements, wherein the plurality of light emitting elements may not be aligned with the first electrode and the second electrode.

Each of the plurality of light emitting elements may include a first semiconductor layer, a second semiconductor layer, and an intermediate layer disposed between the first semiconductor layer and the second semiconductor layer, and the first semiconductor layer may contact the first electrode.

The display device may further include an overcoat layer that encloses the plurality of light emitting elements.

The second electrode may be disposed on an entire area of the overcoat layer.

The first electrode may be an anode electrode, and the second electrode may be a cathode electrode.

A display device and a method of manufacturing the display device in accordance with embodiments do not require a separate alignment when a light emitting diode is formed on a backplane, and allows a plurality of light emitting elements to be bonded in a single process, thereby reducing a process failure rate and shortening a process time.

A display device and a method of manufacturing the display device in accordance with embodiments may be applied to small light emitting diodes, because the contact electrodes of light emitting diodes may be exposed to the outside without an additional process.

DETAILED DESCRIPTION OF THE EMBODIMENTS

Figure 1:
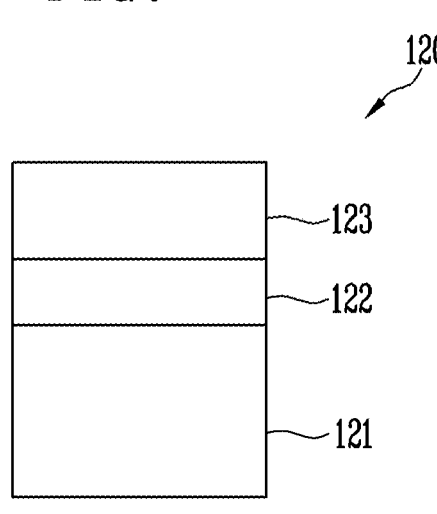
FIG. 1 is a schematic diagram illustrating a structure of a light emitting element in accordance with an embodiment of the disclosure.

As the disclosure allows for various changes and numerous embodiments, particular embodiments will be illustrated in the drawings and described in detail in the written description. However, this is not intended to limit the disclosure to particular modes of practice, and it is to be appreciated that all changes, equivalents, and substitutes that do not depart from the spirit and technical scope are encompassed in the disclosure.

Throughout the disclosure, like reference numerals refer to like parts throughout the various figures and embodiments of the disclosure. The sizes of elements in the accompanying drawings may be exaggerated for clarity of illustration. It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the disclosure. Similarly, the second element could also be termed the first element. In the disclosure, the singular forms are intended to include the plural forms as well, unless the context clearly indicates otherwise.

It will be further understood that the terms "comprise," "include," "have," etc. when used in this specification, specify the presence of stated features, integers, steps, operations, elements, components, and/or combinations of them but do not preclude the presence or addition of one or more other features, integers, steps, operations, elements, components, and/or combinations thereof. Furthermore, when a first part such as a layer, a film, an area, or a plate is disposed on a second part, the first part may be not only directly on the second part but a third part may intervene between them. In addition, when it is expressed that a first part such as a layer, a film, an area, or a plate is formed on a second part, the surface of the second part on which the first part is formed is not limited to an upper surface of the second part but may include other surfaces such as a side surface or a lower surface of the second part. When a first part such as a layer, a film, an area, or a plate is under a second part, the first part may be not only directly under the second part but a third part may intervene between them. When a first part such as a layer, a film, an area, or a plate covers a second part, the first part and second part substantially have the same size and shape and overlap each other. Throughout the specification, when an element is referred to as being "connected" to another element, the element may be "directly connected" to another element, or "electrically connected" to another element with one or more intervening elements interposed therebetween. As used herein, the terms "and," "or," and "and/or" includes any and all combinations of one or more of the associated listed items. In the specification and the claims, the phrase "at least one of" is intended to include the meaning of "at least one selected from the group of" for the purpose of its meaning and interpretation. For example, "at least one of A and B" may be understood to mean "A, B, or A and B."

Hereinafter, a display device and a method of manufacturing the same in accordance with an embodiment of the disclosure will be described with reference to the accompanying drawings.

FIG. 1 is a schematic diagram illustrating a structure of a light emitting element in accordance with an embodiment.

Referring to FIG. 1, a light emitting element 120 in accordance with an embodiment may be a vertical light emitting element formed by sequentially stacking a first semiconductor layer 121, an intermediate layer 122, and a second semiconductor layer 123.

The first semiconductor layer 121 may be implemented as a p-type semiconductor layer, for example. The p-type semiconductor layer may be selected from semiconductor materials having the composition formula of $In_xAl_yGa_{1-x-y}N$ ($0 \leq x \leq 1$, $0 \leq y \leq 1$, $0 \leq x+y \leq 1$), for example, GaN, AlN, AlGaN, InGaN, InN, InAlGaN, and AlInN, and may be doped with a p-type dopant such as Mg, Zn, Ca, Sr, or Ba.

The second semiconductor layer 123 may be formed to contain an n-type semiconductor layer, for example. The n-type semiconductor layer may be selected from semiconductor materials having the composition formula of $In_xAl_yGa_{1-x-y}N$ ($0 \leq x \leq 1$, $0 \leq y \leq 1$, $0 \leq x+y \leq 1$), for example, GaN, AlN, AlGaN, InGaN, InN, InAlGaN, and AlInN, and may be doped with an n-type dopant such as Si, Ge, or Sn.

The embodiments are not limited by the type of semiconductors included in the layers and the first semiconductor layer 121 may include an n-type semiconductor layer, and the second semiconductor layer 123 may include a p-type semiconductor layer. The first semiconductor layer 121 and the second semiconductor layer 123 may each electrically contact a pixel electrode or a common electrode. The pixel electrode or the common electrode may be an anode for hole injection, while the other electrode may be a cathode for electron injection.

The intermediate layer 122 is an area in which electrons and holes may be recombined. As the electrons and the holes are recombined, the intermediate layer 122 may transition to a low energy state and may generate light having a corresponding wavelength. The intermediate layer 122 may be formed to contain a semiconductor material having the composition formula of $In_xAl_yGa_{1-x-y}$ N (0≤x≤1, 0≤y≤1, 0≤x+y≤1), for example. The intermediate layer 122 may be formed as a single quantum well structure or a multi-quantum well (MQW) structure. Furthermore, a quantum wire structure or a quantum dot structure may be included.

Although FIG. 1 illustrates an example where the intermediate layer 122 is formed as a single quantum well structure, the intermediate layer 122 may be formed as a multi-quantum well (MQW) structure in other embodiments. In an embodiment, the intermediate layer 122 may be a multi-layered structure formed by alternately stacking active layers and insulating layers. The active layer and the insulating layer may be formed with the same thickness or be formed with different thicknesses (asymmetric quantum well; AQW).

In an embodiment, the light emitting element 120 may further include an electrode layer (not illustrated) formed on the second semiconductor layer 123. The electrode layer may include metal or a metal oxide. For example, chrome (Cr), titanium (Ti), aluminum (Al), gold (Au), nickel (Ni), ITO (indium tin oxide), and an oxide or alloy thereof may be used alone or in combination with each other. However, the embodiments are not limited thereto.

In an embodiment, the light emitting element 120 may further include an insulating film (not illustrated). Such an insulating film may be omitted as illustrated in FIG. 1. The insulating film may be provided to enclose at least a portion of an outer circumferential surface of each of the first semiconductor layer 121, the intermediate layer 122, and the second semiconductor layer 123. For example, the insulating film may be provided on the portions of the light emitting element 120 excluding the opposite ends at the top and the bottom of light element 120 in FIG. 1, such that the opposite ends of the light emitting element 120 may be exposed. The insulating film may include transparent insulating material. For example, the insulating film may include at least one insulating material selected from the group consisting of $SiO_2$, $Si_3N_4$, $Al_2O_3$, and $TiO_2$, but the embodiments are not limited thereto. Other materials having insulating properties may also be employed.

FIGS. 2 to 11 are schematic cross-sectional views of a process of manufacturing a display device using a transfer film in accordance with an embodiment.

Figure 2:
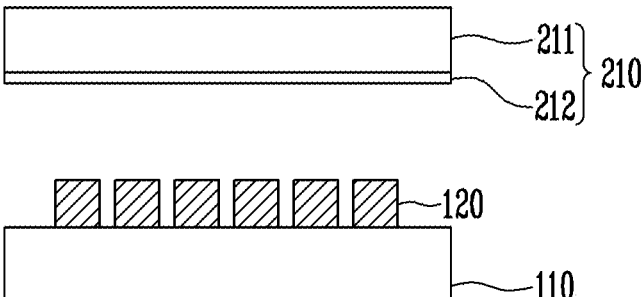
FIGS. 2 to 11 are schematic cross-sectional views of a process of manufacturing a display device using a transfer film in accordance with an embodiment of the disclosure.

Referring to FIG. 2, light emitting elements 120 may be provided on a base substrate 110. The base substrate 110 may be made of a conductive substrate or an insulating substrate, and be formed of at least one of sapphire ($Al_2O_3$), SiC, Si, GaAs, GaN, ZnO, Si, GaP, InP, Ge, and $Ga_2O_3$, for example.

The light emitting elements 120 may emit any one of blue, red, or green light. In other embodiments, some of the light emitting elements 120 may emit blue light, some of the light emitting elements 120 may emit red light, and other light emitting elements 120 may emit green light.

A first transfer film 210 may be provided to be spaced apart from the base substrate 110.

The first transfer film 210 may be made of a stretchable material. Examples of the stretchable material may include polyolefine, polyvinyl chloride (PVC), elastomeric silicone, elastomeric polyurethane, elastomeric polyisoprene, etc., without being limited thereto.

The first transfer film 210 may include a support layer 211 and an adhesive layer 212 disposed on the support layer 211.

The support layer 211 may be transparent to allow light emitted from a light source to be transmitted and may be made of a material having appropriate optical properties and sufficient mechanical stability. For example, the support layer 211 may be a glass substrate, a quartz substrate, or a synthetic resin substrate made of a transparent polymer material having excellent light transmittance, such as polyester, polyacrylate, polyepoxy resin, polyethylene, polystyrene, or polyethylene terephthalate.

The light source may be an infrared laser beam. The light source is disposed behind the support layer 211 (refer to FIG. 13). The laser beam may scan the entire other surface of the support layer 211 or may be selectively irradiated to only a specific area.

The adhesive layer 212 may be formed of a transfer material, for example, an adhesive material for bonding the light emitting element 120. For example, the adhesive layer 212 may include urethane acrylate, epoxy acrylate, polyester acrylate, or the like. In an embodiment, the adhesive strength of the material forming the adhesive layer 212 may change as ultraviolet (UV) or heat is applied, so that the adhesive layer 212 may be easily separated from the transfer material.

Figure 3:
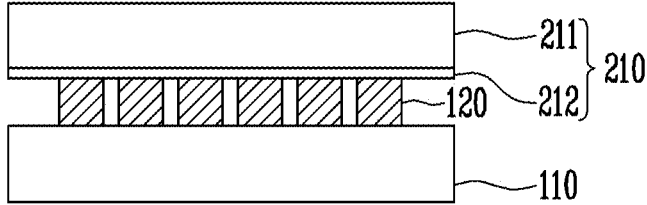

Referring to FIG. 3, since the base substrate 110 and the first transfer film 210 may be disposed adjacent to each other, the light emitting elements 120 formed on the base substrate 110 may be bonded to the adhesive layer 212 of the first transfer film 210.

Figure 4:
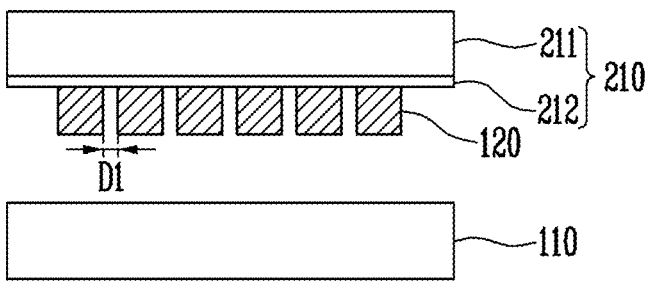

Referring to FIG. 4, the base substrate 110 may be separated from the light emitting elements 120. Although the base substrate 110 may be separated from the light emitting elements 120 through a process such as laser lift off (LLO) or chemical lift off (CLO), the method of separating the base substrate 110 is not limited thereto.

The light emitting elements 120 separated from the base substrate 110 may be temporarily bonded on the adhesive layer 212. The light emitting elements 120 may be disposed at a first distance D1.

Figure 5:
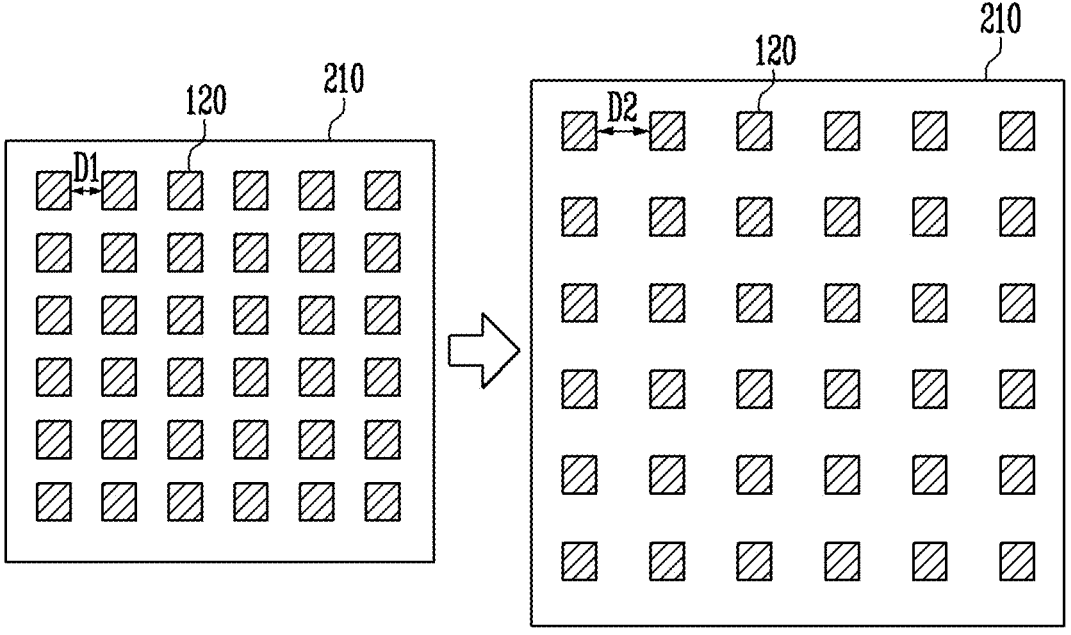
Figure 6:
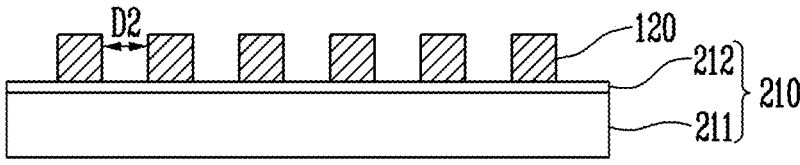

Referring to FIGS. 5 and 6, the first transfer film 210 may be stretched. For example, the first transfer film 210 may be stretched at least in two directions of which one direction intersects another direction. As the first transfer film 210 is stretched, the distance between the light emitting elements 120 bonded to the first transfer film 210 may be uniformly increased from a first distance D1 to a second distance D2 as shown in FIG. 6. The first transfer film 210 may be stretched to have a density corresponding to a pixel (or sub-pixel) area in which the light emitting elements 120 is formed on a TFT array substrate that will be described later. For example, the first transfer film 210 may be stretched such that N light emitting elements 120 are included in an area corresponding to the pixel formed on the TFT array substrate.

Figure 7:
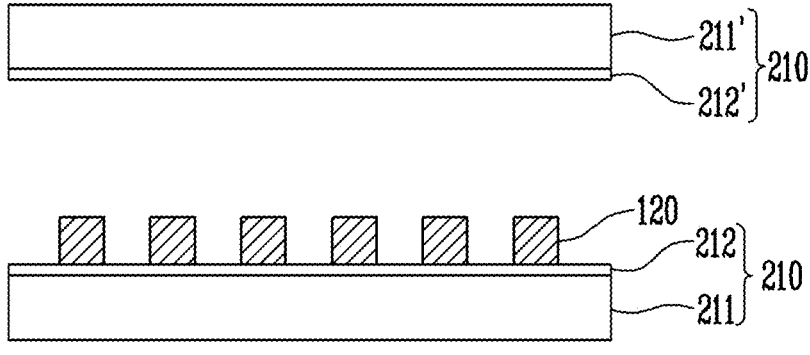

In the embodiments, transfer and stretching operations may be repeatedly performed to obtain the first transfer film 210 on which the light emitting elements 120 may be disposed to have a density corresponding to the pixel area of the TFT array substrate. Referring to FIG. 7, a second transfer film 210' may be provided to be spaced apart from the first transfer film 210 that is manufactured in FIG. 4. The second transfer film 210' may be the same type of transfer film as the first transfer film 210 shown in FIGS. 2 to 6.

Figure 8:
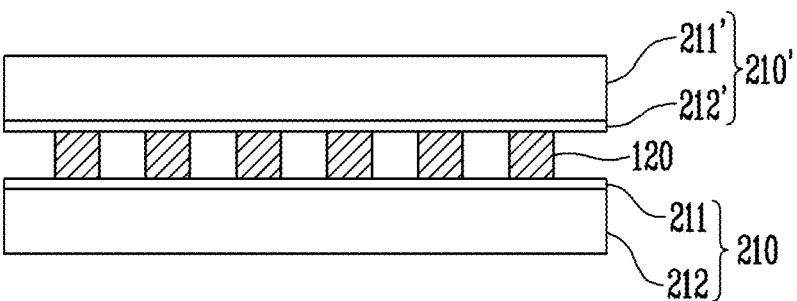

Referring to FIG. 8, as the second transfer film 210' and the first transfer film 210 are disposed adjacent to each other, a light emitting elements 120 formed on the first transfer film 210 may be bonded onto an adhesive layer 212' of the second transfer film 210'.

Figure 9:
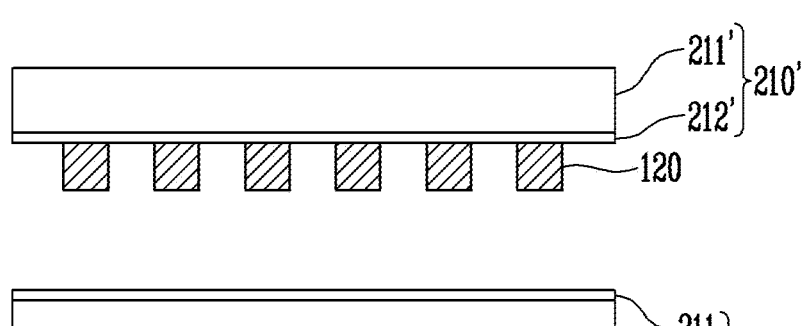
Figure 9:
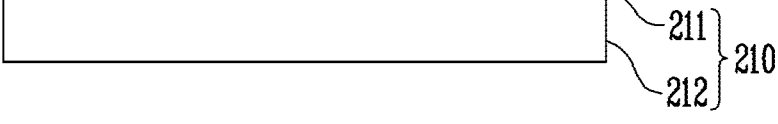
Figure 10:
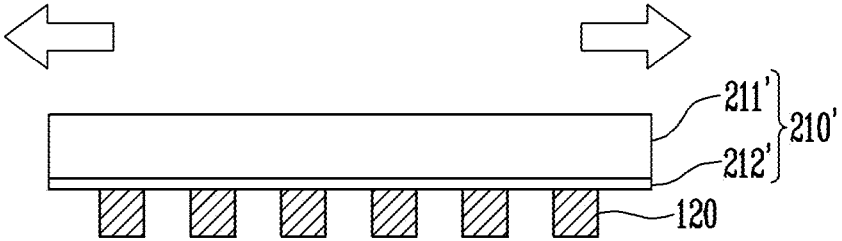
Figure 11:
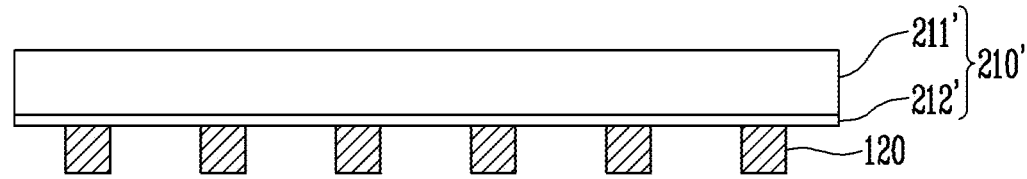

Referring to FIG. 9, the first transfer film 210 may be separated from the light emitting elements 120. Referring to FIG. 10, the second transfer film 210' may be stretched. If the second transfer film 210' is stretched, the distance between the light emitting elements 120 may be increased, and simultaneously the density of the light emitting elements 120 may be reduced. By repeating this process, the density of the light emitting elements 120 may be reduced, and the light emitting elements 120 having a desired density may be formed on the transfer film without damage to the transfer film due to excessive stretching.

Hereinafter, a method of manufacturing the display device in accordance with the embodiments using the transfer film 210' produced through the above-described process will be described in detail.

FIGS. 12 to 18 are schematic cross-sectional views of a process of manufacturing a display device in accordance with an embodiment. In FIGS. 12 to 18, the TFT array substrate 300 is schematically illustrated to describe the method of transferring the light emitting element 120 using the transfer film 210'.

Figure 12:
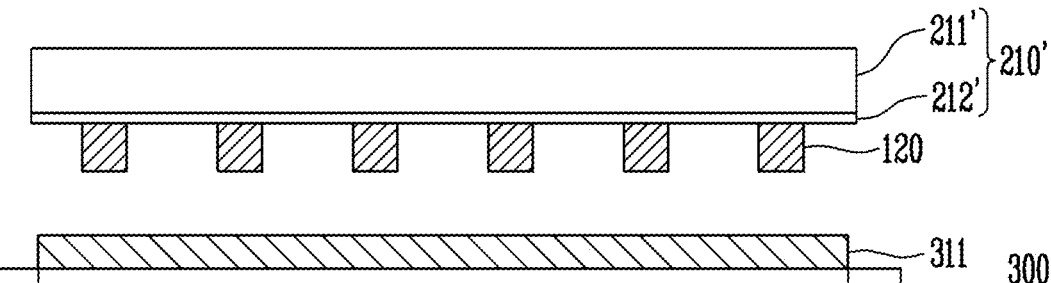
FIGS. 12 to 18 are schematic cross-sectional views of a process of manufacturing a display device in accordance with an embodiment of the disclosure.

First, referring to FIG. 12, the TFT array substrate 300 and the transfer film 210' on which the light emitting elements 120 are formed by FIGS. 1 to 11 may be provided to be spaced apart from each other.

At least one thin film transistor for driving the light emitting elements 120 may be formed on the TFT array substrate 300, and an insulating layer, a planarization layer, and the like may also be formed.

In other embodiments, a first electrode 311 may be formed on the planarization layer of the TFT array substrate 300. The first electrode 311 may be formed on an entire area of a pixel (or sub-pixel) area PA. The pixel (or sub-pixel) area PA may be defined by the first electrode 311.

The first electrode 311 may include a reflective layer formed of Ag, Mg, Al, Pt, Pd, Au, Ni, Nd, Ir, Cr, or a compound thereof, and a transparent or translucent electrode formed on the reflective layer. The transparent or semitransparent electrode may include at least one or more materials selected from the group consisting of indium tin oxide (ITO), indium zinc oxide (IZO), zinc oxide (ZnO), indium oxide ($In_2O_3$), indium gallium oxide (IGO), and aluminum zinc oxide (AZO).

The first electrode 311 may be electrically coupled to at least one thin film transistor formed on the TFT array substrate 300. A detailed structure of the TFT array substrate 300 will be described below with reference to FIG. 19.

The transfer film 210' may be disposed such that the light emitting elements 120 faces the first electrode 311 on the TFT array substrate 300. The light emitting elements 120 disposed at a density corresponding to the pixel area of the TFT array substrate 300 may be included on the adhesive layer 212' of the transfer film 210'.

Figure 13:
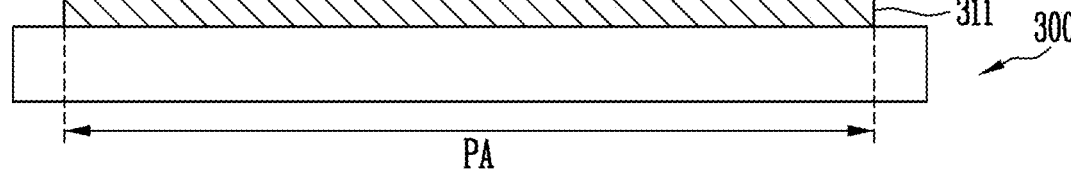
Figure 13:
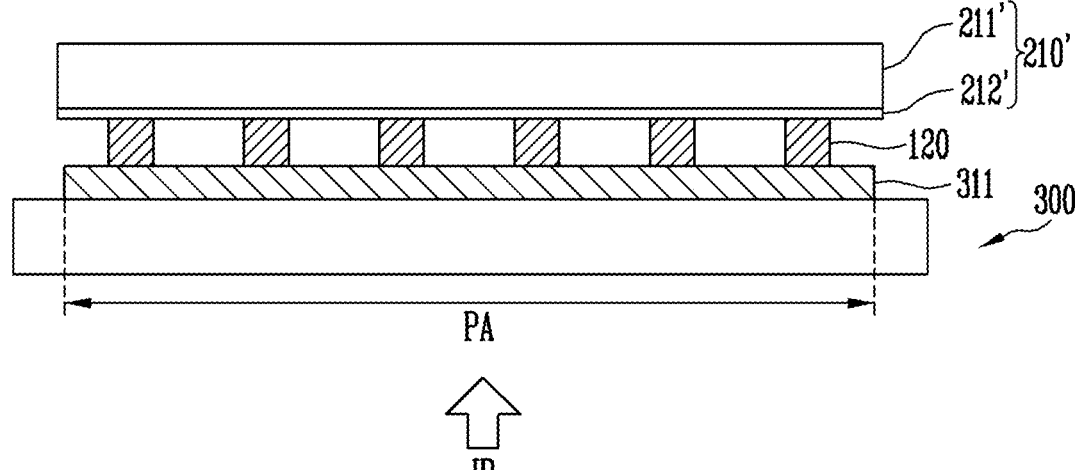

Referring to FIG. 13, the transfer film 210' may be disposed adjacent to the TFT array substrate 300. As the transfer film 210' is disposed adjacent to the TFT array substrate 300, the light emitting elements 120 formed on the transfer film 210' may contact the first electrode 311 of the TFT array substrate 300. As illustrated in FIG. 13, an infrared laser IR may be irradiated onto the rear surface of the transfer film 210' and the light emitting elements 120 on the transfer film 210' may be transferred to the first electrode 311 on the TFT array substrate 300.

The light emitting elements 120 may not be transferred to non-pixel areas NPA in which the first electrode 311 is not formed.

Figure 14:
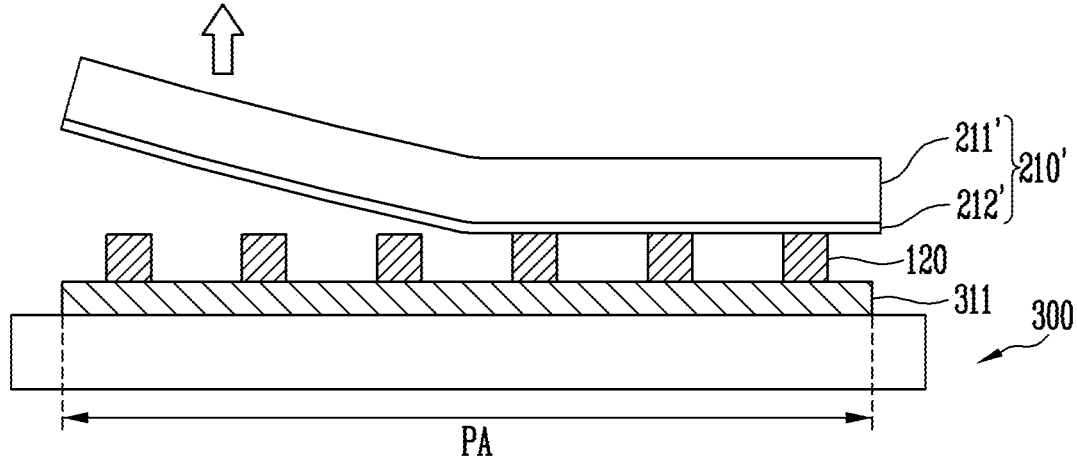

Referring to FIG. 14, the transfer film 210' may be separated from the light emitting elements 120. In an embodiment, when an adhesive force between the light emitting elements 120 and the transfer film 210' is smaller than an adhesive force between the light emitting elements 120 and the first electrode 311, the transfer film 210' may be physically separated from the light emitting elements 120. In other embodiments, after the adhesive strength of the adhesive layer 212' is weakened by irradiating an ultraviolet laser or heat on the rear surface of the transfer film 210', the transfer film 210' may be separated from the light emitting elements 120.

The light emitting elements 120 that are not transferred onto the first electrode 311 may be removed from the TFT array substrate 300 together with the transfer film 210'.

Figure 15:
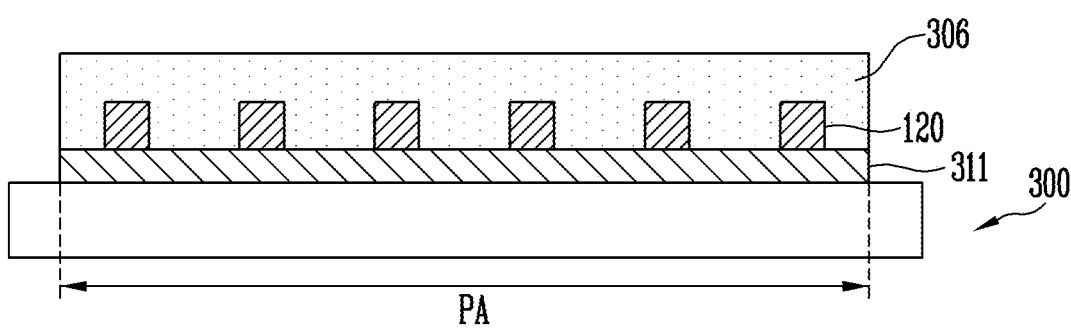
Figure 16:
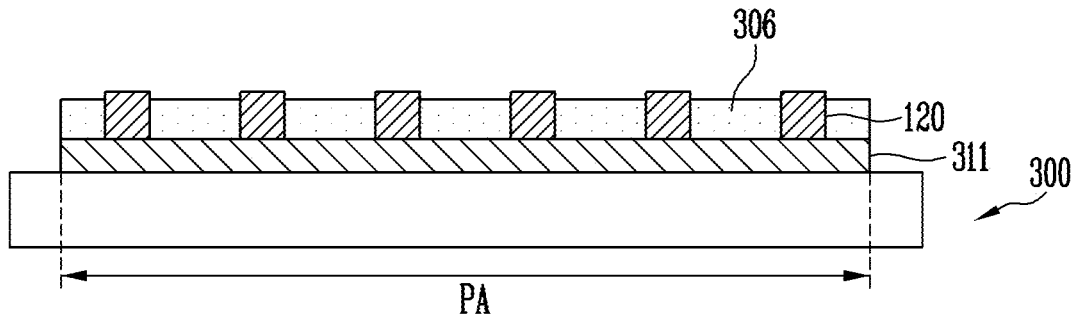

Referring to FIGS. 15 and 16, a second electrode 312 (see FIG. 17) may contact the second semiconductor layer 123 (see FIG. 1) of the light emitting element 120 which may be formed on the TFT array substrate 300 to which the light emitting elements 120 is transferred.

As illustrated in FIG. 15, an overcoat layer 306 may be formed on the TFT array substrate 300 to which the light emitting elements 120 are transferred. An inorganic insulating layer and/or an organic insulating layer may be used for the overcoat layer 306. The inorganic insulating layer may include $SiO_2$, SiNx, SiON, $Al_2O_3$, $TiO_2$, $Ta_2O_5$, $HfO_2$, $ZrO_2$, BST, PZT, etc. The organic insulating layer may include general commodity polymer (PMMA, PS), polymer derivatives having a phenol group, acrylic polymers, imide polymers, arylether polymers, amide polymers, fluorine polymers, p-xylene polymers, vinyl alcohol polymers and these blends thereof. In other embodiments, the overcoat layer 306 may also be formed of a composite stack of an inorganic insulating layer and an organic insulating layer.

The overcoat layer 306 may be a layer for preventing oxygen and moisture from penetrating into the light emitting elements 120, and may be a planarization layer which may prevent uneven steps from being formed on the upper surface. In order to improve the planarization characteristics of the overcoat layer 306, the overcoat layer 306 may be preferably formed of an organic insulating layer or a composite stack. However, the embodiments are not limited thereto and may use an overcoat layer 306 of various other materials, as described above.

The overcoat layer 306 may be formed higher than the light emitting elements 120.

Referring to FIG. 16, the overcoat layer 306 may be etched to expose an end of each of the light emitting elements 120. The overcoat layer 306 may be etched by a process such as dry etching so that at least a portion of the second semiconductor layer 123 of the light emitting elements 120 is exposed.

Figure 17:
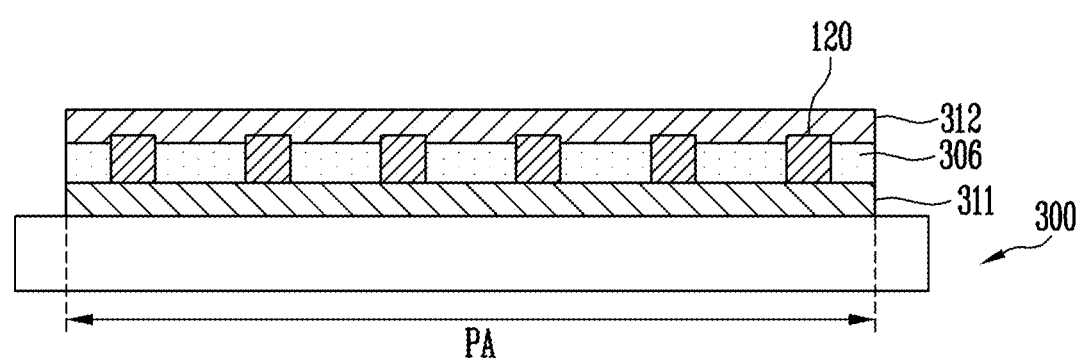

Referring to FIG. 17, the second electrode 312 may be formed on the overcoat layer 306 where a portion of the second semiconductor layer 123 is exposed. The second electrode 312 may be formed to cover an entire area of the overcoat layer 306. The second electrode 312 may be a transparent or translucent electrode and may be formed of a thin film of a metal which has a low work function and includes Li, Ca, LiF/Ca, LiF/Al, Al, Ag, Mg, or a compound thereof. Furthermore, an auxiliary electrode layer or a bus electrode may be further formed on the metal thin film using a material for forming a transparent electrode such as ITO, IZO, ZnO, or $In_2O_3$. Therefore, the second electrode 312 may transmit light emitted from the light emitting element 120.

The display device has been described as a top emission device in which the first electrode 311 reflects light and the second electrode 312 transmits light. However, the embodiments are not limited thereto, and the display device may be a bottom emission device.

By the above process, a structure in which the first electrode 311, the first semiconductor layer 121, the intermediate layer 122, the second semiconductor layer 123, and the second electrode 312 are sequentially stacked may be formed.

Figure 18:
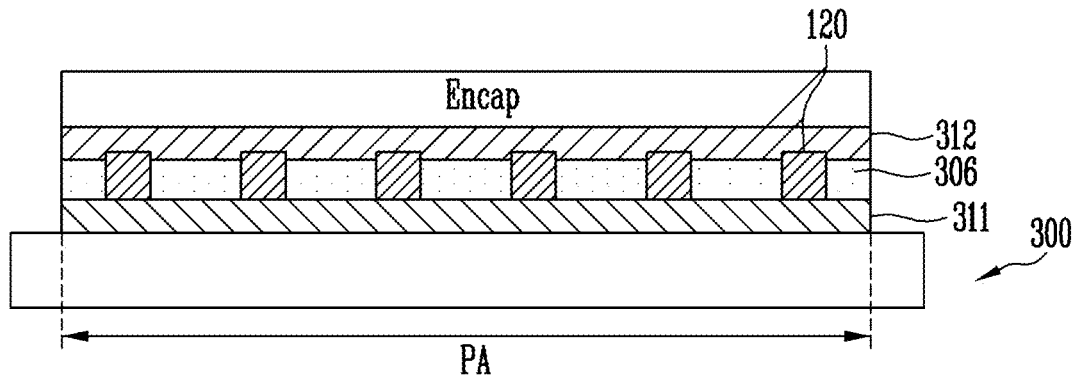

In other embodiments, various passivation layers and/or insulating layers (Encap in FIG. 18) may be further formed on the second electrode 312 by a subsequent process as illustrated in FIG. 18.

According to the embodiments, precise alignment may not be required when the light emitting elements 120 are disposed on the TFT array substrate 300, and the light emitting elements 120 may not be individually transferred onto the TFT array substrate 300 but may be transferred onto the TFT array substrate all at once. The manufacturing efficiency of the display device may be improved, and the failure rate may be reduced.

According to the embodiments, since a separate mask process is not required to form the second electrode 312, it is easy to manufacture display devices including small light emitting elements 120.

Figure 19:
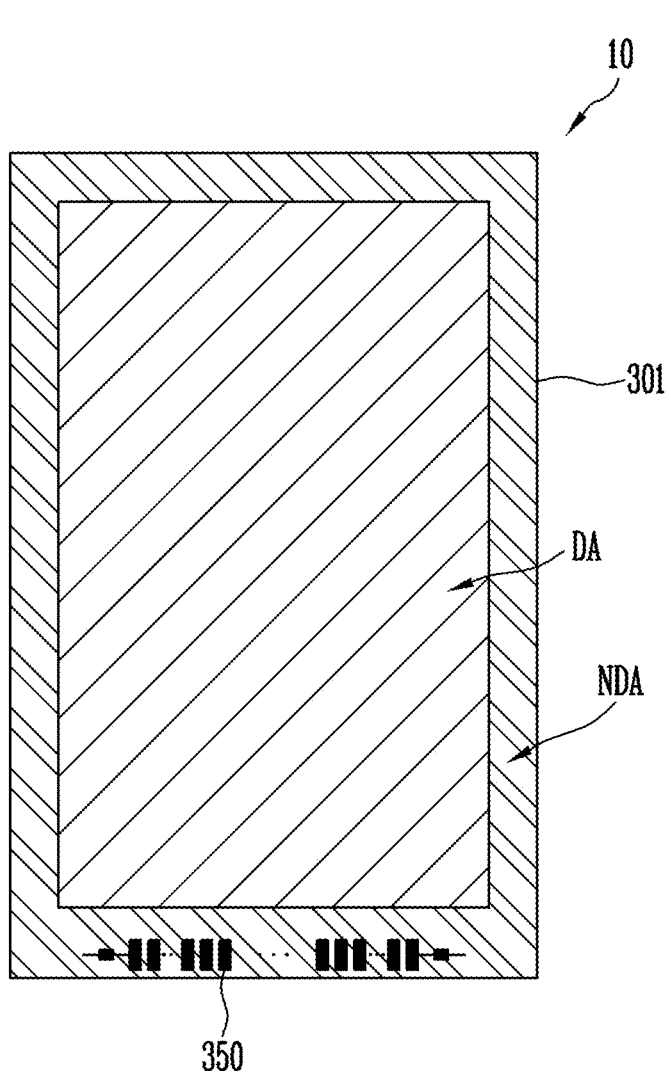
FIG. 19 is a schematic plan view illustrating a display device in accordance with an embodiment of the disclosure.
Figure 20:
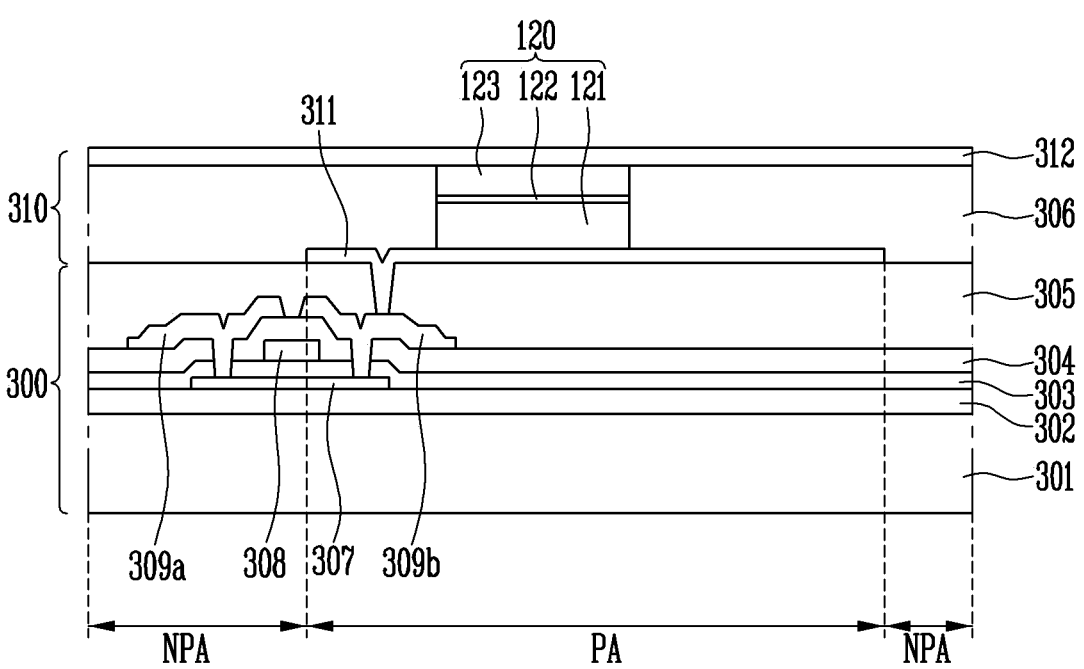
FIG. 20 is a schematic cross-sectional view illustrating an example of section of the display device of FIG. 19.

FIG. 19 is a schematic plan view illustrating a display device in accordance with an embodiment, and FIG. 20 is a schematic cross-sectional view schematically illustrating an example of section of the display device of FIG. 19.

Referring to FIGS. 19 and 20, a display device 10 in accordance with an embodiment may include a TFT array substrate 300 and an emission layer 310 disposed on the TFT array substrate 300.

The TFT array substrate 300 may include a substrate 301, a thin film transistor (an active layer 307, a gate electrode 308, a source electrode 309a and a drain electrode 309b) on the substrate 301, and a planarization layer 305 on the thin film transistor. A first electrode 311 may be electrically connected to the thin film transistor through a via hole that may be formed in the planarization layer 305.

A display area DA and a non-display area NDA outside the display area DA may be defined on the substrate 301. A power line or the like may be disposed in the non-display area NDA. Furthermore, a pad component 350 may be disposed in the non-display area NDA.

The substrate 301 may include various materials. For example, the substrate 301 may be made of a transparent glass material containing $SiO_2$ as a main component. However, the substrate 301 is not necessarily limited thereto, and may be formed of a transparent plastic material to have flexibility. The plastic material may be an organic material selected from a group consisting of insulating organic materials such as polyethersulphone (PES), polyacrylate (PAR), polyetherimide (PEI), polyethylene naphthalate (PEN), polyethylene terephthalide (PET), polyphenylene sulfide (PPS), polyallylate, polyimide, polycarbonate (PC), cellulose triacetate (TAC), cellulose acetate propionate (CAP).

In a bottom emission type, in which an image is formed in the direction of the substrate 301, the substrate 301 may be formed of a transparent material. However, in a top emission type, in which an image is formed in an opposite direction to the substrate 301, the substrate 301 may not necessarily be formed of a transparent material. The substrate 301 may be formed of metal.

When the substrate 301 is formed of metal, the substrate 301 includes one or more metals selected from a group consisting of iron, chromium, manganese, nickel, titanium, molybdenum, stainless steel (SUS), Invar alloy, Inconel alloy, and Kovar alloy, but the embodiments are not limited thereto.

A buffer layer 302 may be formed on the substrate 301. The buffer layer 302 may provide a flat surface on the upper portion of the substrate 301 and may prevent foreign matter or moisture from penetrating the substrate 301. For example, the buffer layer 302 may contain inorganic materials such as silicon oxide, silicon nitride, silicon oxynitride, aluminum oxide, aluminum nitride, titanium oxide or titanium nitride, or organic materials such as polyimide, polyester, or acryl. It may be formed of multiple stacks of these materials.

The thin film transistor may include an active layer 307, a gate electrode 308, a source electrode 309a, and a drain electrode 309b.

Hereinafter, the thin film transistor will be described as a top gate type in which the active layer 307, the gate electrode 308, the source electrode 309a, and the drain electrode 309b may be sequentially formed. However, the embodiments are not limited thereto, and various types of thin film transistors, such as a bottom gate type, may also be employed.

The active layer 307 may include a semiconductor material, such as amorphous silicon or poly crystalline silicon. However, the embodiments are not limited thereto and the active layer 307 may contain other materials. The active layer 307 may contain an organic semiconductor material.

In other embodiments, the active layer 307 may contain an oxide semiconductor material. For example, the active layer 307 may include oxides selected from Groups 12, 13, and 14 metal elements such as zinc (Zn), indium (In), gallium (Ga), tin (Sn) cadmium (Cd), or germanium (Ge), and combinations thereof.

The gate insulating layer 303 may be formed on the active layer 307. The gate insulating layer 303 may serve to insulate the active layer 307 and the gate electrode 308 from each other. The gate insulating layer 303 may be formed in a multi-layer or single-layer structure made of an inorganic material such as silicon oxide and/or silicon nitride.

The gate electrode 308 may be formed above the gate insulating layer 303. The gate electrode 308 may be electrically connected to a gate line (not illustrated) that applies an on/off signal to the thin film transistor. The gate electrode 308 may be made of a low resistance metal material. Taking into account the compaction between adjacent layers, the surface flatness of stacked layers, and the processability, the gate electrode 308 may be formed to have a single layer structure or a multi-layer structure, e.g., using one or more materials of aluminum (Al), platinum (Pt), palladium (Pd), silver (Ag), magnesium (Mg), gold (Au), nickel (Ni), neodymium (Nd), iridium (Ir), chrome (Cr), lithium (Li), calcium (Ca), molybdenum (Mo), titanium (Ti), tungsten (W), and copper (Cu).

An interlayer insulating layer 304 may be formed on the gate electrode 308. The interlayer insulating layer 304 may insulate a source electrode 309a and a drain electrode 309b from the gate electrode 308. The interlayer insulating layer 304 may be formed to have a multi-layer or single-layer structure made of an inorganic material. For instance, the inorganic material may be metal oxide or metal nitride, and the inorganic material may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc.

The source electrode 309a and the drain electrode 309b may be formed on the interlayer insulating layer 304. The source electrode 309a and the drain electrode 309b may be formed to have a single layer structure or a multi-layer structure using one or more materials of aluminum (Al), platinum (Pt), palladium (Pd), silver (Ag), magnesium (Mg), gold (Au), nickel (Ni), neodymium (Nd), iridium (Ir), chrome (Cr), lithium (Li), calcium (Ca), molybdenum (Mo), titanium (Ti), tungsten (W), and copper (Cu). The source electrode 309a and the drain electrode 309b may be formed to contact the area of the active layer 307.

The planarization layer 305 may be formed on the thin film transistor. The planarization layer 305 may be formed to cover the thin film transistor, to eliminate uneven steps caused by the thin film transistor, and to flatten the upper surface, thereby preventing defects from occurring in the emission layer 310 due to uneven lower parts.

The planarization layer 305 may be formed to have a single layer structure or a multi-layered structure using an organic material. The organic material may include general commodity polymer such as polymethylmethacrylate (PMMA) or polystyrene (PS), polymer derivatives having a phenol group, acrylic polymers, imide polymers, arylether polymers, amide polymers, fluorine polymers, p-xylene polymers, vinyl alcohol polymers and blends thereof. Furthermore, the planarization layer 305 may be formed of a composite stack of an inorganic insulating layer and an organic insulating layer.

The first electrode 311 and the emission layer 310 may be located on the planarization layer 305.

The first electrode 311 may be formed to cover an entire area of the pixel (or sub-pixel) area PA. The pixel (or sub-pixel) area PA may be defined by the first electrode 311. The first electrode 311 may be electrically coupled to a thin film transistor. The first electrode 311 may be electrically connected to the drain electrode 309b through the contact hole formed in the planarization layer 305. The first electrode 311 may have various shapes, and be formed by patterning in an island shape, for example.

The first electrode 311 may include a reflective layer formed of Ag, Mg, Al, Pt, Pd, Au, Ni, Nd, Ir, Cr, and a compound thereof, and a transparent or translucent electrode layer formed on the reflective layer. The transparent or translucent electrode layer may include at least one or more materials selected from the group consisting of indium tin oxide (ITO), indium zinc oxide (IZO), zinc oxide (ZnO), indium oxide ($In_2O_3$), indium gallium oxide (IGO), and aluminum zinc oxide (AZO).

The emission layer 310 may include the light emitting element 120 electrically coupled to the thin film transistor, and the overcoat layer 306 enclosing the light emitting element 120.

The light emitting element 120 may emit red, green, or blue light, and may implement white light by using a fluorescent material or by combining colors. The light emitting element 120 may include a first semiconductor layer 121, a second semiconductor layer 123, and an intermediate layer 122 interposed between the first semiconductor layer 121 and the second semiconductor layer 123.

The first semiconductor layer 121 may be implemented as a p-type semiconductor layer, for example. The p-type semiconductor layer may be selected from semiconductor materials having the composition formula of $In_xAl_yGa_{1-x-y}N$ ($0 \leq x \leq 1$, $0 \leq y \leq 1$, $0 \leq x+y \leq 1$), for example, GaN, AlN, AlGaN, InGaN, InN, InAlGaN, and AlInN, and may be doped with a p-type dopant such as Mg, Zn, Ca, Sr, or Ba.

The second semiconductor layer 123 may be formed to contain an n-type semiconductor layer, for example. The n-type semiconductor layer may be selected from semiconductor materials having the composition formula of $In_xAl_yGa_{1-x-y}N$ ($0 \leq x \leq 1$, $0 \leq y \leq 1$, $0 \leq x+y \leq 1$), for example, GaN, AlN, AlGaN, InGaN, InN, InAlGaN, and AlInN, and may be doped with an n-type dopant such as Si, Ge, or Sn.

However, the embodiments are not limited thereto. The first semiconductor layer 121 may include the n-type semiconductor layer, and the second semiconductor layer 123 may include the p-type semiconductor layer.

The intermediate layer 122 is an area in which electrons and holes are recombined. As the electrons and the holes are recombined, the intermediate layer may transition to a low energy level and may generate light having a corresponding wavelength. The intermediate layer 122 may be formed to contain a semiconductor material having the composition formula of $In_xAl_yGa_{1-x-y}N$ ($0 \leq x \leq 1$, $0 \leq y \leq 1$, $0 \leq x+y \leq 1$), for example. The intermediate layer 122 may be formed as a single quantum well structure or a multi-quantum well (MQW) structure. Furthermore, a quantum wire structure or a quantum dot structure may be included.

The overcoat layer 306 may be a layer for preventing oxygen and moisture from penetrating into the light emitting elements 120, and may be a planarization layer which may prevent uneven steps from being formed on the upper surface. The overcoat layer 306 may be formed higher than the light emitting elements 120.

The second electrode 312 may be formed on the emission layer 310. The second electrode 312 may be formed to cover an entire area of the emission layer 310. The second electrode 312 may be a transparent or translucent electrode and be formed of a thin film of a metal which has a low work function and includes Li, Ca, LiF/Ca, LiF/Al, Al, Ag, Mg, or a compound thereof. Furthermore, an auxiliary electrode layer or a bus electrode may be further formed on the metal thin film using a material for forming a transparent electrode such as ITO, IZO, ZnO, or $In_2O_3$. Therefore, the second electrode 312 may transmit light emitted from the light emitting element 120. The first electrode 311 may be an anode electrode and the second electrode 312 may be a cathode electrode.

When the light emitting elements 120 are disposed on the TFT array substrate 300 by the method illustrated in FIGS. 12 to 18, the light emitting elements 120 may be disposed at regular intervals on the first electrode 311. The light emitting elements 120 may be disposed without being aligned with other elements in the TFT array substrate 300, such as the first electrode and the second electrode.

It will be understood to those skilled in the art that the embodiments may be implemented in different forms without changing the technical ideas or essential characteristics. Therefore, it should be understood that the embodiments are only for illustrative purposes and do not limit the bounds of the invention. It is intended that the bounds of the embodiments are defined by the accompanying claims, and various modifications, additions, and substitutions, which may be derived from the meaning, scope, and equivalent concepts of the accompanying claims, fall within the bounds of the embodiments.

What is claimed is:

1. A method of manufacturing a display device, comprising:

forming light emitting elements on a stretchable film;

stretching the stretchable film; and disposing the light emitting elements onto a first electrode disposed on a substrate, wherein the disposing includes transferring the light emitting elements on the first electrode without being aligned with respect to the first electrode by stretching the stretchable film so that a density of the light emitting elements on the stretchable film corresponds to a density of the pixel area on the substrate, and wherein the first electrode, on which the light emitting elements are disposed, is a single component formed on an entire area of the pixel area.

2. The method according to claim 1, wherein the disposing includes arranging the light emitting elements on the substrate to be spaced apart at a predetermined interval, and the stretching includes controlling an interval information of the light emitting elements so that the light emitting elements are spaced at the predetermined interval on the stretchable film.

3. The method according to claim 1, wherein the stretching includes stretching the stretchable film in two or more directions to uniformly change an interval between the light emitting elements from a first interval to a second interval greater than the first interval.

4. The method according to claim 1, wherein an area in which the first electrode is disposed on the substrate is a transfer area in which the light emitting elements is configured to be transferred.

5. The method according to claim 4, wherein the area does not include a non-transfer area to which the light emitting elements is not configured to be transferred.

6. The method according to claim 1, wherein the stretchable film includes a support layer and an adhesive layer on the support layer, the support layer is configured to transmit an infrared laser, and an adhesive force of the adhesive layer is changed in case ultraviolet laser or heat is applied.

7. The method according to claim 6, wherein the support layer and the adhesive layer contact each other.

8. The method according to claim 6, wherein the stretchable film includes a first surface corresponding to the light emitting elements and a second surface corresponding an area wherein the light emitting elements are not disposed, and the disposing comprises irradiating the infrared laser onto the second surface of the stretchable film.

9. The method according to claim 1, further comprising removing the stretchable film from the light emitting elements after the disposing.

10. The method according to claim 9, wherein the removing includes removing, together with the stretchable film, a non-transferred light emitting element.

11. The method according to claim 10, wherein in the removing, a first adhesive force between the light emitting elements and the stretchable film is smaller than a second adhesive force between the light emitting elements and the first electrode.

12. The method according to claim 11, wherein the removing includes irradiating an ultraviolet laser or heat onto the stretchable film.

13. The method according to claim 1, wherein the substrate further includes a transistor and a planarization layer on the transistor, the first electrode is disposed on the planarization layer, and the first electrode is electrically connected to the transistor through via hole formed in the planarization layer.

14. The method according to claim 13, wherein the light emitting elements include a first semiconductor layer, a second semiconductor layer, and an intermediate layer between the first semiconductor layer and the second semiconductor layer, the disposing includes transferring the light emitting elements such that the first semiconductor layer faces the first electrode, and the first electrode is anode.

15. The method according to claim 13, wherein the first electrode includes a reflective layer and a transparent or translucent layer on the reflective layer.

16. The method according to claim 13, further comprising:

forming an overcoat layer on the planarization layer to cover the light emitting elements;

etching at least a portion of the overcoat layer such that an end of each of the light emitting elements is exposed; and forming a second electrode on an etched overcoat layer, wherein the second electrode is formed to cover an entire area of the etched overcoat layer.

17. The method according to claim 1, further comprising:

disposing the light emitting elements on an additional stretchable film; and stretching the additional stretchable film.

18. The method according to claim 17, wherein an interval between the light emitting elements on the stretchable film is smaller than an interval between the light emitting elements on the additional stretchable film after the stretching the additional stretchable film.

19. The method of claim 1, wherein the disposing includes irradiating an infrared laser through the stretchable film.

20. The method of claim 1, further comprising:

removing the stretchable film from the light emitting elements after the disposing, wherein the removing includes irradiating an ultraviolet laser or heat onto the stretchable film.

21. A display device, comprising:

a substrate including a pixel area;

a first electrode entirely disposed in the pixel area of the substrate; and light emitting elements electrically connected to the first electrode and disposed on the first electrode, wherein the light emitting elements are not aligned with the first electrode by using a stretchable film comprising the light emitting elements to apply the light emitting elements to the substrate and by stretching the stretchable film so that a density of the light emitting elements on the stretchable film corresponds to a density of the pixel area on the substrate, and the light emitting elements comprise light emitting diodes, wherein the first electrode, on which the light emitting elements are disposed, is a single component formed on an entire area of the pixel area.

22. The display device according to claim 21, wherein the first electrode is disposed on an entire area of the pixel area.

23. The display device according to claim 21, further comprising a second electrode electrically connected to the light emitting elements, wherein the light emitting elements are randomly disposed in the entire area, and the second electrode entirely covers upper portions of the light emitting elements.

24. The display device according to claim 23, wherein the first electrode is anode, and the second electrode is cathode.

25. The display device according to claim 24, further comprising an overcoat layer covering a side surface of each of the light emitting elements and a portion of the first electrode on which the light emitting elements are not disposed, wherein the second electrode entirely covers the overcoat layer.

\* \* \* \* \*